United States Patent
Mukhopadhyay et al.

(10) Patent No.: US 11,837,999 B2
(45) Date of Patent: Dec. 5, 2023

(54) AUDIO AMPLIFIER HAVING IDLE MODE

(71) Applicant: Maxim Integrated Products, Inc., San Jose, CA (US)

(72) Inventors: Rajdeep Mukhopadhyay, Edinburgh (GB); Euan Murphy, West Lothian (GB); Matt Felder, Austin, TX (US); Simon Quinn, Edinburgh (GB)

(73) Assignee: Maxim Integrated Products, Inc., San Jose, CA (US)

( * ) Notice: Subject to any disclaimer, the term of this patent is extended or adjusted under 35 U.S.C. 154(b) by 263 days.

(21) Appl. No.: 17/227,899

(22) Filed: Apr. 12, 2021

(65) Prior Publication Data

US 2021/0367566 A1 Nov. 25, 2021

Related U.S. Application Data

(60) Provisional application No. 63/027,295, filed on May 19, 2020.

(51) Int. Cl.
*H03F 3/217* (2006.01)
*H03K 5/24* (2006.01)
*H03F 1/02* (2006.01)

(52) U.S. Cl.
CPC ............ *H03F 3/217* (2013.01); *H03K 5/24* (2013.01); *H03F 2200/03* (2013.01); *H03F 2200/171* (2013.01)

(58) Field of Classification Search
CPC ............ H03F 3/217; H03F 2200/03; H03F 2200/171; H03F 3/183; H03F 3/2173; H03K 5/24

USPC ........................................ 330/10, 251, 207 A
See application file for complete search history.

(56) References Cited

U.S. PATENT DOCUMENTS

| | | | |
|---|---|---|---|
| 8,264,275 B2 * | 9/2012 | Greimel-Rechling | H03G 3/3021 330/10 |
| 8,416,017 B2 | 4/2013 | Kohut et al. | |
| 9,036,836 B2 * | 5/2015 | Zhang | H03F 3/2173 330/10 |
| 10,320,352 B1 | 6/2019 | Liao et al. | |
| 2004/0232978 A1 | 11/2004 | Easson et al. | |
| 2013/0089161 A1 | 4/2013 | Heineman | |

* cited by examiner

*Primary Examiner* — Hieu P Nguyen
(74) *Attorney, Agent, or Firm* — Kevin E. West; Advent, LLP

(57) ABSTRACT

An audio amplifier employs an idle mode to reduce power consumption and improve efficiency of the amplifier. The audio amplifier comprises a modulator configured to receive an analog input signal. The modulator is operable to convert the analog input signal to differential first and second quantized signals, each having a common mode duty cycle. The modulator causes the common mode duty cycle of each of the first and second quantized signals to be shifted when the level of the analog input signal is below a threshold level so that the common mode duty cycle is one of greater than or less than fifty percent (50%). The amplifier further includes a power stage that receives the first and second quantized signals and generates corresponding first and second output signals configured to drive a load, wherein the first and second output signals switched between a supply voltage and a second voltage based on the respective first and second quantized signals.

11 Claims, 10 Drawing Sheets

AUDIO AMPLIFIER HAVING IDLE MODE

BACKGROUND

Audio amplifiers amplify low-power electronic audio signals and produce magnified output signals having a power level that is sufficient to drive a speaker to produce sound. Several types, or classes, of audio amplifiers have been developed, which are categorized by one or two letter class designators (e.g., Class A, Class B, Class A/B, Class D, etc.). Class D amplifiers are often used in applications where low power consumption is important. A Class D amplifier employs amplifying devices such as transistors, typically MOSFETs, that operate as electronic switches, and not as linear gain devices as in amplifiers of other classes. The MOSFETs rapidly switch back and forth between two supply rail voltages and are fed by a modulator employing one of several common modulation techniques (e.g., pulse width modulation (PWM), pulse density modulation (PDM), delta-sigma modulation (DSM), etc.) to encode the audio input signal into a pulse train. The modulated audio signal may then be passed through a low-pass LC filter to block high-frequency pulses before being used to drive a load such as a speaker. Since the pairs of output transistors are never conducting at the same time, there is no other path for current flow apart from the low-pass filter/speaker making the Class D amplifier highly efficient.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims.

DETAILED DESCRIPTION

Overview

Figure 1:
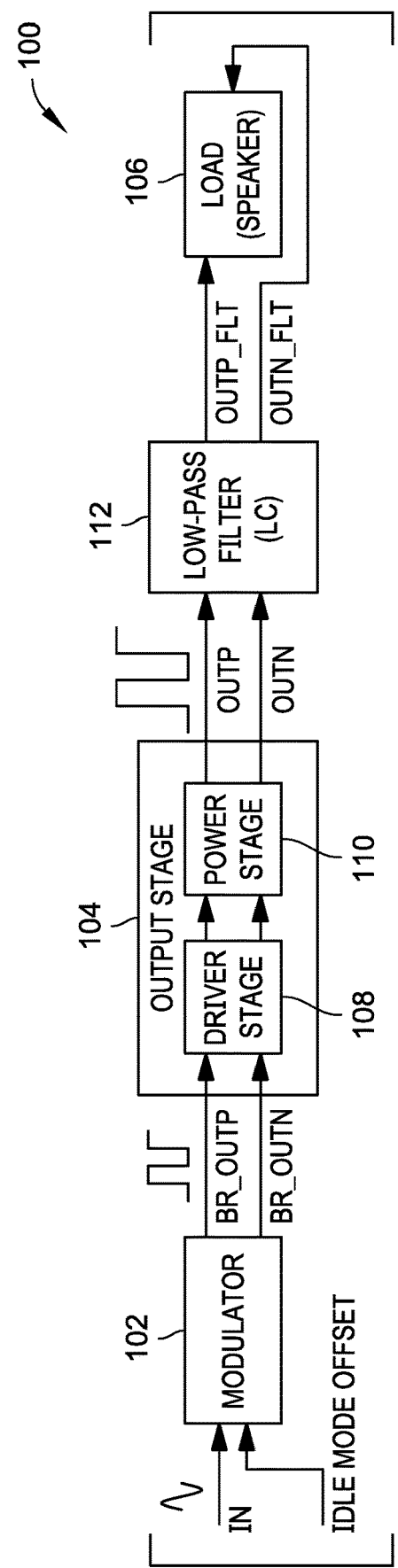
FIG. 1 is a block diagram illustrating an amplifier configured with an idle mode in accordance with a example embodiment of the present disclosure.

Class D audio amplifiers employed by smart speakers must drive increasingly higher output voltages. However, larger voltage differential (dV/dt) is a key contributor to electromagnetic interference (EMI) emissions in audio circuits using such amplifiers. It is desirable to reduce conducted EMI emissions, which are usually measured at outputs below 15 MHz. To achieve this reduction, audio circuits often employ low-pass LC filters that attenuate signals having frequencies higher than a cutoff frequency to filter EMI emissions from the output signals provided to the speaker.

While a variety of modulator topologies may be used in modern Class D amplifiers, one common topology, BD modulation, utilizes pulse-width modulation (PWM) with a triangle-wave (or sawtooth) waveform generator or oscillator to encode the audio input signal. BD modulation modulates the duty cycle of the difference of the output signals such that its average content corresponds to the input analog signal. BD modulation provides superior audio performance (e.g., reduced pop and click). However, BD modulation with no (or with a low level of) audio signal has significantly higher power consumption than do other common modulation techniques, such as AD modulation, when low-pass LC filters are used. BD modulation has significant common mode content in its output. Consequently, a correlation exists between common mode duty cycle, inductor current ripple, and power consumption. Power consumption is highest at common mode duty cycles at or near fifty percent (50%) because ripple current is highest at those duty cycles.

Accordingly, an audio amplifier is disclosed that employs an idle mode when there is no or very low audio signal, to reduce power consumption and improve efficiency of the amplifier. The amplifier comprises a modulator configured to receive an analog input signal. The modulator is operable to convert the analog input signal to differential first and second quantized signals, each having a common mode duty cycle. The modulator causes the common mode duty cycle of each of the first and second quantized signals to be shifted when the level of the analog input signal is below a threshold level so that the common mode duty cycle is one of greater than or less than fifty percent (50%). The amplifier further includes a power stage that receives the first and second quantized signals and generates corresponding first and second output signals configured to drive a load, wherein the first and second output signals are switched between a supply voltage and a second voltage based on the respective first and second quantized signals. In embodiments, the power stage continues to switch the first and second output signals between the supply voltage and the second voltage while the common mode duty cycle of each of the first and second quantized signals is shifted.

A modulator suitable for use in an audio amplifier having an idle mode is also disclosed. The modulator comprises an amplifier assembly configured to receive an analog audio input signal having a first voltage and to furnish differential first and second modulation signals, wherein the first modulation signal has a second voltage and the second modulation signal has a third voltage. A waveform generator generates a waveform signal having a fourth voltage centered on a common mode voltage. A comparator assembly is configured to receive the waveform signal and the first and second modulation signals and to provide respective differential first and second quantized signals, wherein each of the first and second quantized signals has a common mode duty cycle. During idle mode, when the first voltage is below a threshold voltage, at least one of the fourth voltage or the second and third voltages are increased or decreased to shift the common mode duty cycles of the first and second quantized signals so that the common mode duty cycles are one of greater than or less than fifty percent (50%). In embodiments, the power stage continues to switch the first and second output signals between the supply voltage and the second voltage while the common mode duty cycle of each of the first and second quantized signals is shifted.

In embodiments, the amplifiers disclosed herein may comprise Class D audio amplifiers employing BD modulation. In such embodiments, the audio amplifier includes a BD modulator configured to receive an analog audio signal having a first voltage and an idle mode offset having an offset voltage. The BD modulator includes an amplifier assembly operable to furnish differential first and second modulation signals derived from the first voltage, wherein the first modulation signal has a second voltage and the second modulation signal has a third voltage. A triangle wave generator generates a triangle wave signal having a fourth voltage centered on a common mode voltage. A comparator assembly receives the triangle wave signal from the triangle wave generator and the first and second modulation signals from the amplifier assembly and provides respective differential first and second quantized signals, wherein each of the first and second quantized signals have a common mode duty cycle. During idle mode, when the first voltage is below a threshold voltage, the BD modulator is configured to cause the second and third voltages or the fourth voltage to be increased or decreased to shift the common mode duty cycles of the first and second quantized signals so that the common mode duty cycles are one of greater than or less than fifty percent (50%). A power stage receives the first and second quantized signals and generating respective first and second output signals, wherein the first and second output signals are switched between a supply voltage and a fifth voltage based on the first and second quantized signals. In embodiments, the power stage continues to switch the first and second output signals between the supply voltage and the second voltage while the common mode duty cycle of each of the first and second quantized signals is shifted. A low-pass LC filter receives the first and second output signals from the power stage and filters electromagnetic interference. The first and second output signals are configured to drive a speaker.

In embodiments, the digital output signals are shifted as a function of the amplitude of the analog audio signal. For example, the common mode duty cycle of each of the first and second quantized signals, and the corresponding output signals are shifted when the level (voltage) of the analog input signal is below the threshold level (voltage) until the level of the analog input signal is above a second threshold level (voltage), wherein the second threshold level (voltage) is higher than the first threshold level (voltage).

Example Implementations

FIG. 1 illustrates an amplifier 100 configured with an idle mode in accordance with an example embodiment of the present disclosure. As shown, the amplifier 100 comprises a modulator 102 configured to receive an analog input signal (IN). The modulator 102 is operable to convert or modulate the analog input signal (IN) to provide differential first (P) and second (N) quantized signals (BR_OUTP, BR_OUTN). In embodiments, the modulator 102 employs pulse width modulation (PWM) to encode the audio input signal (IN) into a pulse train to generate the quantized signals (BR_OUTP, BR_OUTN). However, it is contemplated that the modulator 102 may employ other modulation techniques such as pulse density modulation (PDM), delta-sigma modulation (DSM), and so forth.

The amplifier 100 further includes an output stage 104 that receives the first and second quantized signals (BR_OUTP, BR_OUTN) from the modulator 102 and generates corresponding first (P) and second (N) output signals (OUTP, OUTN) configured to drive a resistive load 106 such as a speaker, or the like. As shown, the output stage 104 may include a driver stage 108 and a power stage 110. In embodiments, the power stage 110 includes two or more switching devices such as power transistors (e.g., field effect transistors (FETs) and, in particular, metal-oxide semiconductor field-effect transistors (MOSFETs)) arranged in a half bridge or full bridge. These half bridges cause the first and second output signals (OUTP, OUTN) to be switched between a supply voltage and a second voltage based on the respective first and second quantized signals (BR_OUTP, BR_OUTN). The driver stage 108 receives the first and second quantized signals (BR_OUTP, BR_OUTN) from the modulator 102, level shifts them if necessary, and drives the power transistors in the power stage 110.

The amplifier 100 may further include a low-pass filter 112 between the output stage 104 and the load (speaker) 106. The filter 112 receives the output signals (OUTP, OUTN) from the output stage 104 and filters electromagnetic interference from the signals (OUTP, OUTN). The filtered output signals (OUTP_FLT, OUTN_FLT) are then used to drive the load (speaker) 106. In embodiments, the filter 112 comprises a low-pass LC filter that prevents high-frequency switching energy from being dissipated in the resistive load (speaker) 106.

The quantized signals (BR_OUTP, BR_OUTN) each comprise a common mode component having a common mode duty cycle. As the level (i.e., the voltage (V)) of the input signal (IN) decreases, the duty cycles of the first and second quantized signals (BR_OUTP, BR_OUTN) approach the common mode duty cycle. Thus, when no input signal (IN) is present, the level (voltage (V) of the input signal of the input signal (IN) is zero (0), causing the duty cycles of the first and second quantized signals (BR_OUTP, BR_OUTN) are equal to the common mode duty cycle, which is fifty percent (50%) resulting in increased power usage and reducing the efficiency of the amplifier 100.

In accordance with the present disclosure, the amplifier 100 is provided with an idle mode of operation when there is no or very low input signal (IN) to reduce power consumption and improve efficiency of the amplifier 100. During the idle mode, when the level of the analog input signal (IN) drops below a threshold level, the modulator 102 is configured to cause the common mode duty cycle of each of the first and second quantized signals (BR_OUTP, BR_OUTN) to be shifted so that the common mode duty cycle is greater than or less than fifty percent (50%). For example, as shown in FIG. 1, the modulator 102 is configured to receive an idle mode offset signal (IDLE MODE OFFSET) that causes the modulator 102 to shift the duty cycles of the first and second quantized signals (BR_OUTP, BR_OUTN) when the level of the analog input signal (IN) drops below a threshold level. In embodiments, the threshold level comprises a threshold voltage and the modulator 102 compares the voltage level of the analog input signal (IN) with the threshold voltage. When the voltage level of the analog input signal (IN) falls below the threshold voltage, the modulator implements the idle mode to shift the common mode duty cycles of the first and second quantized signals (BR_OUTP, BR_OUTN). In embodiments, the switching devices (e.g., MOSFETS arranged in half-bridges) of the power stage 110 continue to switch the first and second output signals (OUTP, OUTN) between the supply voltage and the second voltage while the common mode duty cycle of each of the first and second quantized signals (BR_OUTP, BR_OUTN) is shifted away from fifty percent (50%). In an embodiment, the threshold voltage is substantially zero volts (0V). The threshold voltage may also be programmable so that it may be set, for example, using an input to the modulator 102. In embodiments, the idle mode of the amplifier 100 may be disabled. For example, the modulator 102 may be configured so that shifting of the common mode duty cycles of the first and second quantized signals (BR_OUTP, BR_OUTN) can be selectively disabled by the idle mode offset signal (IDLE MODE OFFSET).

In embodiments, the amplifier 100 may be an audio amplifier, and, in particular, a Class D audio amplifier. In such embodiments, the load 106 may comprise a speaker and the analog input signal may comprise an analog audio signal. The audio amplifier may employ BD modulation such that the modulator 102 comprises a BD modulator. However, it is contemplated that other modulation schemes (e.g., AD modulation) may be utilized.

Figure 2:
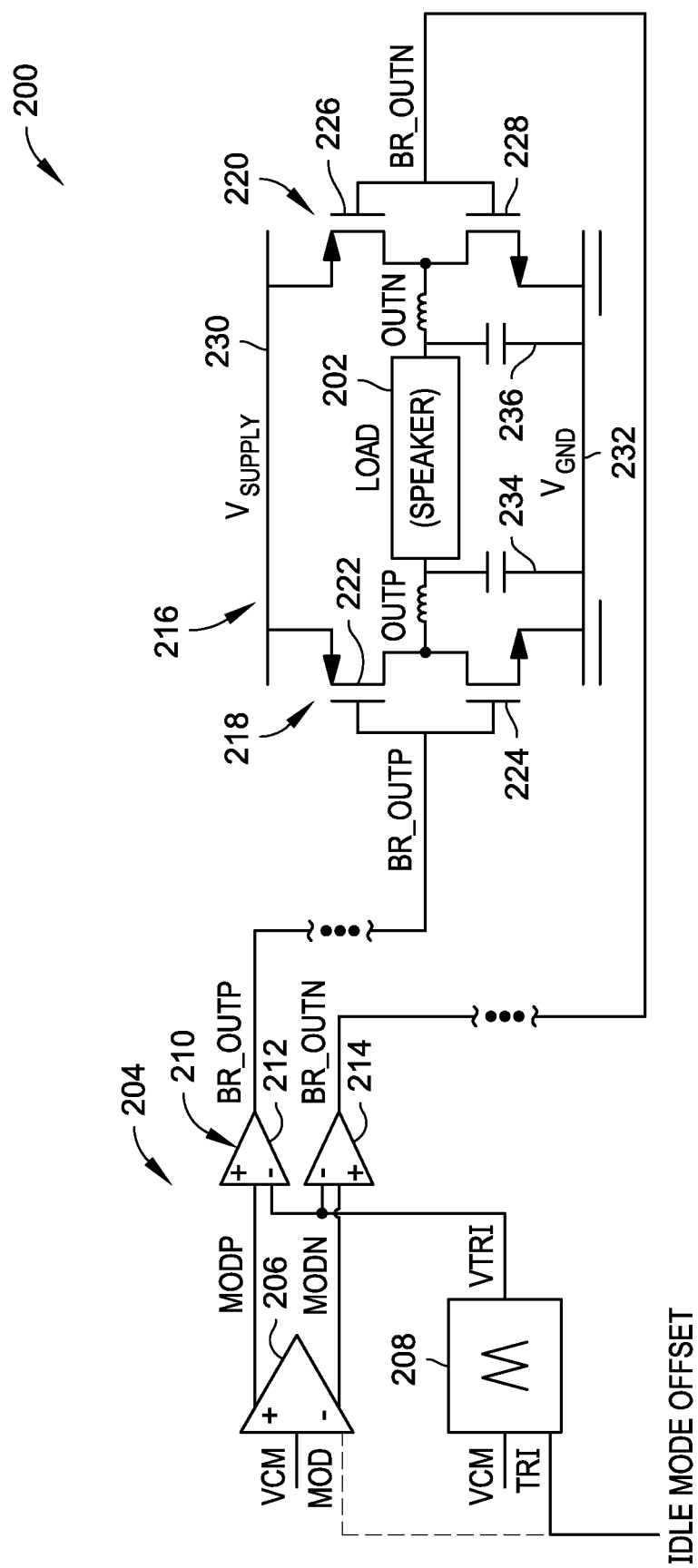
FIG. 2 is a circuit diagram further illustrating an example audio amplifier employing an idle mode in accordance with the present disclosure.

FIG. 2 illustrates an amplifier 200 configured with an idle mode in accordance with an example embodiment of the present disclosure. Like the amplifier 100 shown in FIG. 1, the amplifier 200 is configured to receive an analog input signal having a common mode component and to drive a load 202 such as a speaker, or the like, based on that input signal.

The amplifier 200 includes a modulator 204 having an amplifier assembly 206 that may comprise one or more amplifiers or other components. When no analog input signal is present, the amplifier assembly 206 receives the common mode signal (VCM_MOD) having a voltage equal to one half of the common mode voltage ($V_{REFC}/2$). The amplifier assembly 206 generates differential first (P) and second (N) modulation signals (MODP, MODN), wherein the first modulation signal (MODP) has a second voltage and a second modulation signal (MODN) has a third voltage.

The modulator 204 further includes a waveform generator 208 for generating a waveform signal having a fourth voltage centered on a common mode voltage ($V_{REFC}$) In the embodiment illustrated, the waveform generator 208 comprises a triangle wave generator configured to receive a waveform input signal (VCM_TRI) that causes the waveform generator 208 to generate a triangle wave signal (V_TRI) having a fourth voltage centered on the common mode voltage ($V_{REFC}/2$). In other embodiments, waveform generators 206 producing other waveforms, such as a sawtooth wave, may be utilized. However, it is contemplated that such other waveforms will have voltages also centered on the common mode voltage ($V_{REFC}$) when idle mode is not enabled.

A comparator assembly 210 is coupled to amplifier assembly 206 and the waveform generator 208 and receives the first and second modulation signals (MODP, MODN) and the waveform (triangle wave) signal (V_TRI). As shown in FIG. 2, the comparator assembly 210 includes a first (P) comparator 212 having a positive analog input terminal that receives the first modulation signal (MODP) and a negative analog input terminal that receives the waveform (triangle wave) signal (V_TRI). The first comparator 212 outputs a first (P) quantized signal (BR_OUTP). As further shown, the comparator assembly 210 also includes a second (N) comparator 214 having a negative analog input terminal that receives the second modulation signal (MODN) and a positive analog input terminal that receives the waveform (triangle wave) signal (V_TRI). The second comparator 214 outputs the second (N) quantized signal (BR_OUTN).

In embodiments, the comparator assembly employs pulse width modulation (PWM) to encode the first and second modulation signals (MODP, MODN) into a pulse trains to generate the first and second quantized signals (BR_OUTP, BR_OUTN). However, it is contemplated that other modulation techniques, such as pulse density modulation (PDM), delta-sigma modulation (DSM), and so forth, may also be utilized.

The output stage of the amplifier 200, illustrated in FIG. 2, employs a full-bridge power stage 216 comprised of two half-bridges 218, 220 that drive the load (speaker) 202 differentially in a bridge-tied load (BTL) configuration. Each half bridge 218, 220 includes two output switching devices such as transistors (metal-oxide-semiconductor field-effect transistors (MOSFETs) 222, 224 and 226, 228, respectively, are shown). The first half bridge 218 includes a first p-channel MOSFET 222 having its gate coupled to the first (P) quantized signal produced by comparator 212, its source coupled to a supply voltage rail ($V_{SUPPLY}$) 230, and its drain coupled with the load (speaker) 202, and a second n-channel MOSFET 224 having its gate coupled to the first (P) quantized signal produced by comparator 212, its source coupled to a second voltage such as a ground rail ($V_{GND}$) 232, and its drain coupled with the load (speaker) 202. The second half bridge 220 includes a first p-channel MOSFET 226 having its gate coupled to the second (N) quantized signal produced by comparator 214, its source coupled to a supply voltage rail ($V_{SUPPLY}$) 230, and its drain coupled with the load (speaker) 202, and a second n-channel MOSFET 228 having its gate coupled to the second (N) quantized signal produced by comparator 214, its source coupled to a second voltage such as a ground rail ($V_{GND}$) 232, and its drain coupled with the load (speaker) 202. As shown, the p-channel and n-channel MOSFETs 222, 226 and 224, 228, respectively, operate as current-steering switches by alternately connecting their output (OUTP, OUTN) to the supply voltage ($V_{SUPPLY}$) and a second voltage (e.g., ground ($V_{GND}$)) so that the resulting outputs (OUTP, OUTN) are high-frequency square waves.

Lowpass LC filters 234, 236 are provided between each half bridge 218, 220, respectively, and the load (speaker) 202 to recover the amplified audio signal. The low-pass LC filters 234, 236 filter electromagnetic interference from the output signals (OUTP, OUTN) preventing high-frequency switching energy from being dissipated in the resistive load (speaker) 202.

Because the output signals (OUTP, OUTN) comprise square waves that are pulse-width modulated by the input audio signal, the resulting duty cycles of the output signals (OUTP, OUTN) are proportional to the level of the input signal. When no input signal is present, the duty cycles of the output signal (OUTP, OUTN) waveforms is equal to fifty percent (50%).

In accordance with the present disclosure, the audio amplifier 200 illustrated in FIG. 2 includes an idle mode of operation when there is no or very low input signal to reduce power consumption and improve efficiency of the amplifier 200. During the idle mode, when the voltage of the analog input signal drops below a threshold level, the common mode component of the input signal (VCM_MOD), which has a voltage equal to one half of the common mode voltage ($V_{REFC}/2$), is input to the amplifier assembly 206. The modulator 204 is configured to cause the common mode duty cycle of each of the first and second quantized signals (BR_OUTP, BR_OUTN) to be shifted so that the common mode duty cycle is greater than or less than fifty percent (50%). In embodiments, the p-channel and n-channel MOSFETs 222, 226 and 224, 228, respectively, continue to switch the first and second output signals (OUTP, OUTN) between the supply voltage ($V_{SUPPLY}$) and a second voltage (e.g., ground ($V_{GND}$)) while the common mode duty cycle of each of the first and second quantized signals (BR_OUTP, BR_OUTN) is shifted away from fifty percent (50%). In an embodiment, the threshold voltage is substantially zero volts (0V). The threshold voltage may also be programmable so that may be set, for example, using an input to the modulator 204.

As shown in FIG. 2, an idle mode offset signal (IDLE MODE OFFSET) is provided as an input to the waveform generator 208. The idle mode offset signal (IDLE MODE OFFSET) causes a voltage offset to be added to (or subtracted from) the voltage of the waveform (triangle wave) input signal (VCM_TRI) by the waveform generator 208 so that the voltage of the triangle wave signal (V_TRI) is increased (or decreased) and thus no longer centered on the common mode voltage ($V_{REFC}/2$). In other embodiments, the idle mode offset signal (IDLE MODE OFFSET) may cause a voltage offset to be added to (or subtracted from) the voltage of the common mode component of the input signal (VCM_MOD) by the amplifier assembly 206 so that the voltages of the differential first (P) and second (N) modulation signals (MODP, MODN) are increased (or decreased). Increasing (or decreasing) either or both of the voltage of the waveform (triangle wave) signal (V_TRI) and the first (P) and second (N) modulation signals (MODP, MODN) causes the common mode duty cycles of the first and second quantized signals (BR_OUTP, BR_OUTN) output by the respective first and second comparators 212, 214 of the comparator assembly 210 to be shifted so that the common mode duty cycles of the quantized signals (BR_OUTP, BR_OUTN) are one of greater than or less than fifty percent (50%). In this manner, the power consumed by the load (speaker) 202 is substantially reduced, increasing the efficiency of the amplifier 200.

In embodiments, the idle mode of the amplifier 200 may be disabled. For example, in an embodiment, the modulator 204 may be configured so that shifting of the common mode duty cycles of the first and second quantized signals (BR_OUTP, BR_OUTN) can be selectively disabled by disabling the idle mode offset signal (IDLE MODE OFFSET).

Figure 3A:
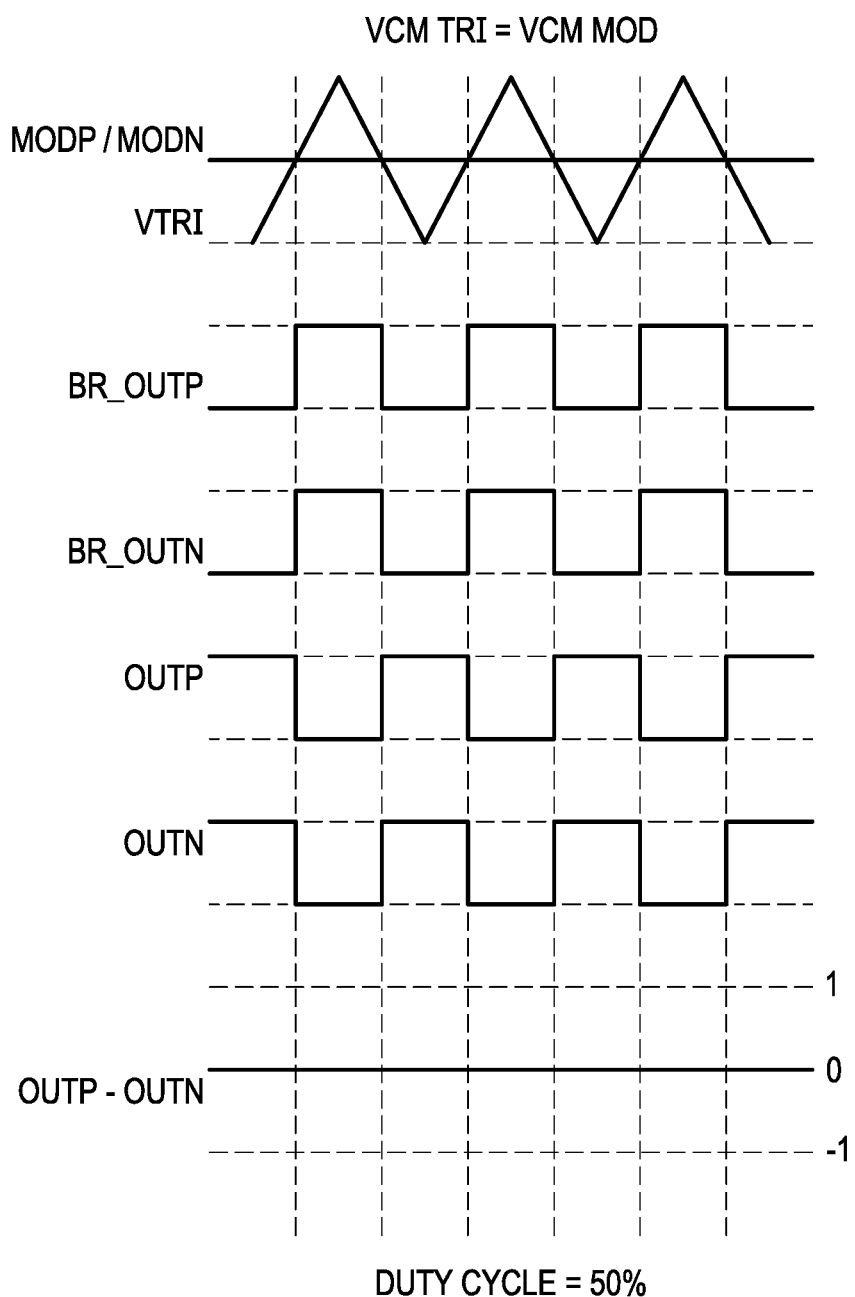
FIGS. 3A, 3B, and 3C are signal diagrams illustrating the implementation of an idle mode by an audio amplifier, such as the example amplifiers shown in FIGS. 1 and 2, in accordance with the present disclosure.
Figure 3B:
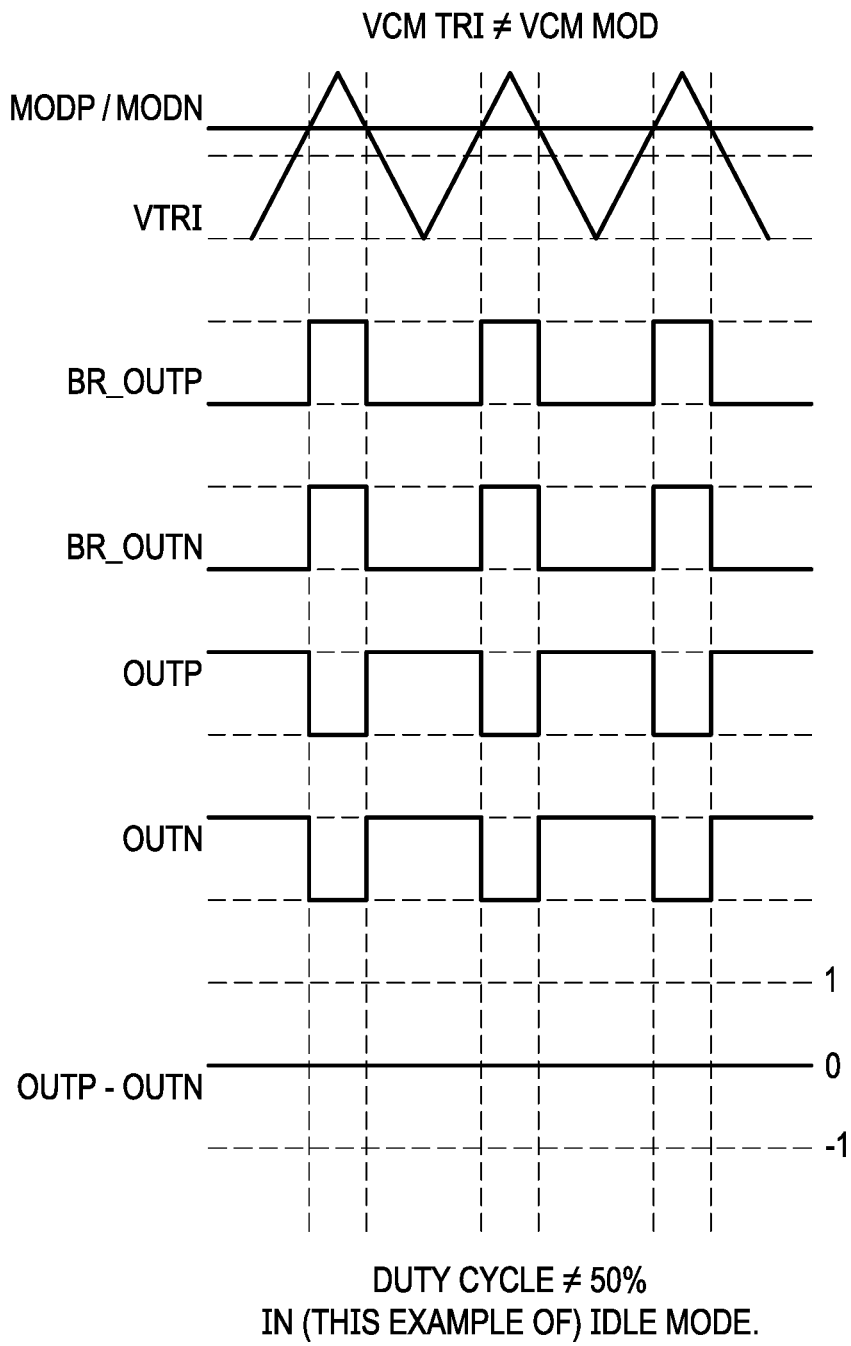
Figure 3C:
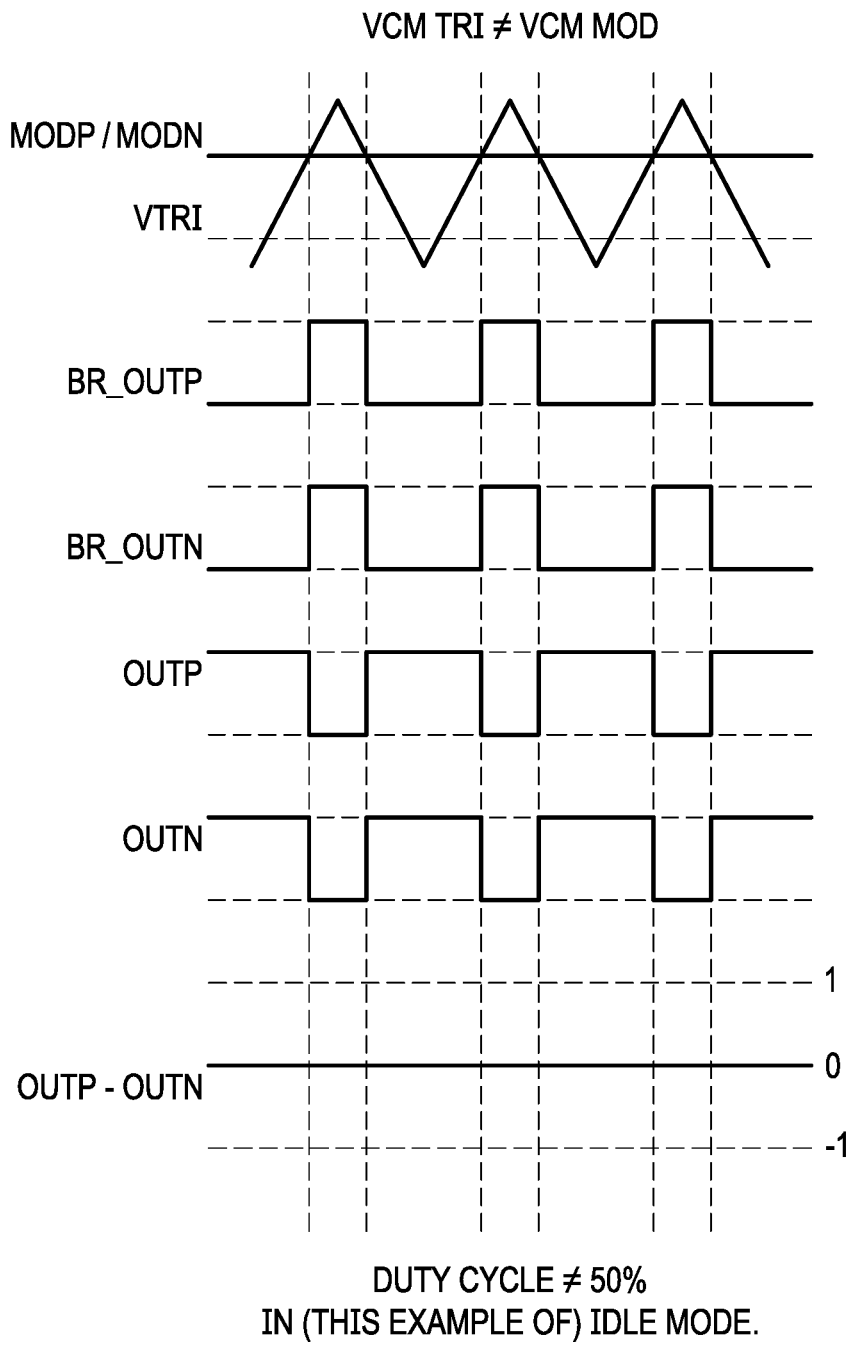

FIGS. 3A, 3B, and 3C illustrate the implementation of an idle mode by the example amplifiers 100, 200 illustrated in FIGS. 1 and 2, respectively. As shown in FIG. 3A, when no analog input signal is present, the voltage of the common mode component (VCM_MOD) is equal to one half of the common mode voltage ($V_{REFC}/2$). Thus, the voltage of the common mode component (VCM_MOD) is equal to the average voltage of the waveform (triangle wave) input signal (VCM_TRI), which has a voltage centered on one half of the common mode voltage ($V_{REFC}/2$) (VCM_MOD=VCM_TRI). Consequently, the voltages of the differential first (P) and second (N) modulation signals (MODP, MODN) are also equal one half of the common mode voltage ($V_{REFC}/2$) and are thus also equal to the average voltage of the waveform (triangle wave) signal (V_TRI). The quantized signals (BR_OUTP, BR_OUTN) and resulting output signals (OUTP, OUTN) comprise square waves that are generated using pulse-width modulation from their respective modulation signals (MODP, MODN) and the waveform (triangle wave) signal (V_TRI). Consequently, when no input signal is present, the resulting duty cycles of the quantized signals (BR_OUTP, BR_OUTN) and output signals (OUTP, OUTN) is equal to fifty percent (50%) and the differential output signal (OUTP-OUTN) is equal to zero (0).

Figure 4:
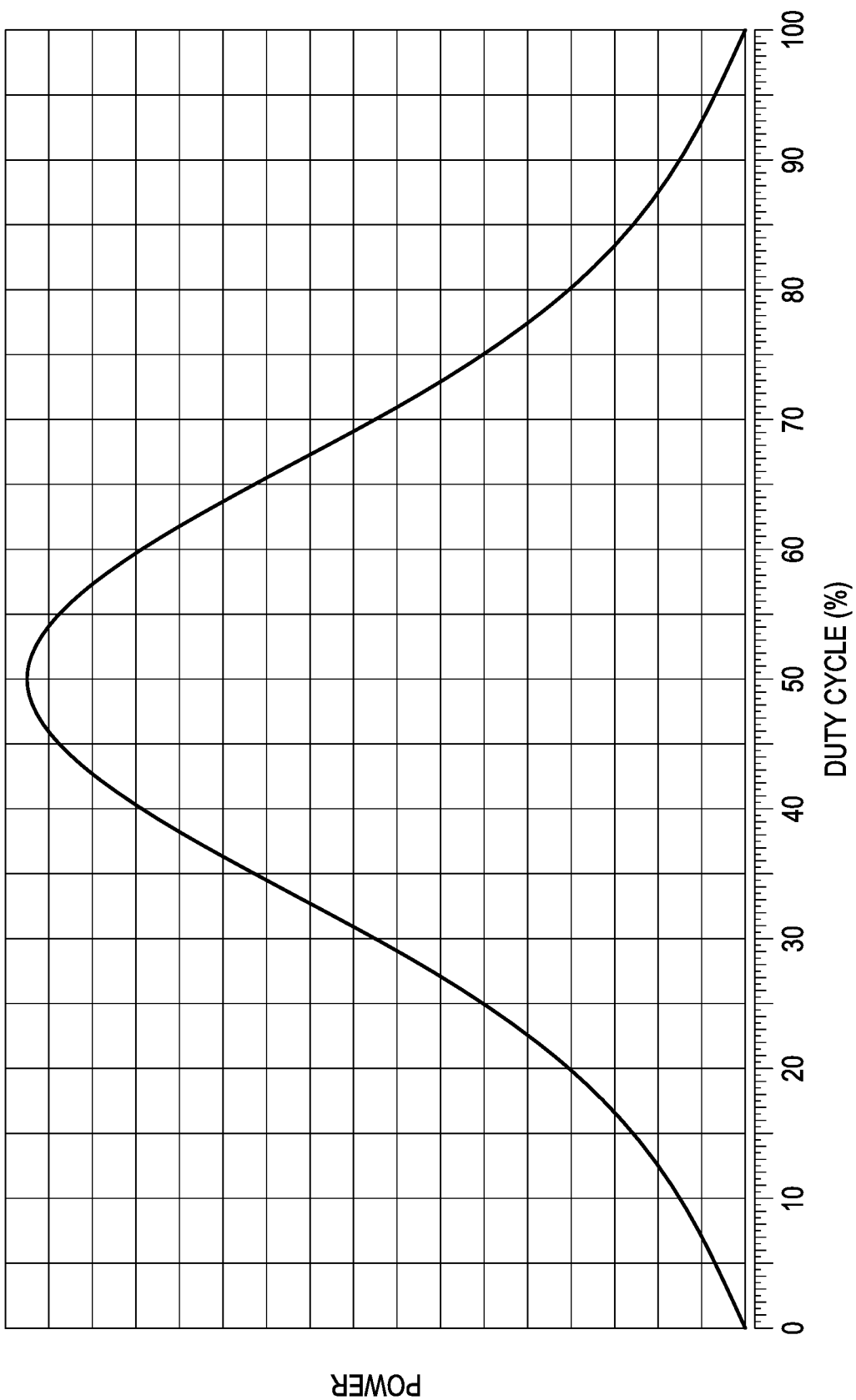
FIG. 4 is a graph illustrating the relationship between the power consumed by a load, such as a speaker, that is driven by an amplifier and the duty cycle of the output signals of the amplifier in accordance with the present disclosure.

Referring now to FIG. 4, the relationship between the duty cycle of the quantized signals (BR_OUTP, BR_OUTN) and output signals (OUTP, OUTN) of the amplifiers 100, 200 shown in FIGS. 1 and 2, and the amount power required by the load (speaker) is illustrated. As shown, the amount of power required decreases as the duty cycle approaches zero percent (0%) and/or one hundred percent (100%) and increases as the duty cycle approaches fifty percent (50%). Consequently, when no analog input signal (IN) is present, the power consumed is at a maximum and thus can be lessened by shifting the duty cycle of the quantized signals (BR_OUTP, BR_OUTN) and output signals (OUTP, OUTN) away from fifty percent (50%).

As shown in FIGS. 3B and 3C, in idle mode, a voltage offset is added to (or subtracted from) one or both of the voltage of the common mode component signal (VCM_MOD) or to the voltage of the waveform (triangle wave) input signal (VCM_TRI).

In FIG. 3B, the voltage offset is added to (or subtracted from) the voltage of the common mode component (VCM_MOD). Thus, in idle mode, the voltage of the common mode component (VCM_MOD) is equal to one half of the common mode voltage shifted by the offset voltage (($V_{REFC}/2$) $\pm V_{OFFSET}$). As shown, the voltage of the common mode component (VCM_MOD) is thus no longer equal to the average voltage of the waveform (triangle wave) input signal (VCM_TRI), which has a voltage centered on the common mode voltage ($V_{REFC}/2$). Shifting the voltage of the common mode component (VCM_MOD) by the offset voltage ($V_{OFFSET}$) causes the voltages of the modulation signals (MODP, MODN) to be increased (or decreased). In the embodiment illustrated, the voltages of the modulation signals (MODP, MODN) are also equal to one half of the common mode voltage shifted (increased or decreased) by the offset voltage (($V_{REFC}/2$) $\pm V_{OFFSET}$). The voltages of the modulation signals (MODP, MODN) are thus offset from (no longer equal to) the average voltage of the waveform (triangle wave) signal (V_TRI), which has a voltage centered on the common mode voltage ($V_{REFC}/2$). This offset causes the common mode duty cycles of the first and second quantized signals (BR_OUTP, BR_OUTN) to be shifted so that the common mode duty cycles of the quantized signals (BR_OUTP, BR_OUTN), and by consequence, the common mode duty cycles of the output signals (OUTP, OUTN) to be shifted away from fifty percent (50%). However, because the output signals (OUTP, OUTN) are shifted by the same amount, the differential output signal (OUTP-OUTN) remains equal to zero (0).

In FIG. 3C, the voltage offset is instead added to (or subtracted from) the waveform (triangle wave) input signal (VCM_TRI) so that the average voltage of the waveform (triangle wave) input signal (VCM_TRI) is centered on one half of the common mode voltage shifted by the offset voltage (($V_{REFC}/2$) $\pm V_{OFFSET}$). Thus, in this embodiment, the average voltage of the waveform (triangle wave) input signal (VCM_TRI) is no longer equal to the voltage of the common mode component (VCM_MOD), which has a voltage equal to one half of the common mode voltage ($V_{REFC}/2$). Shifting the average voltage of the waveform (triangle wave) signal (VCM_TRI) by the offset voltage ($V_{OFFSET}$) causes the average voltage of the waveform (triangle wave) signal (V_TRI) to also be increased (or decreased). In the embodiment illustrated, the waveform (triangle wave) signal (V_TRI) has an average voltage centered one half of the common mode voltage shifted (increased or decreased) by the offset voltage (($V_{REFC}/2$) $\pm V_{OFFSET}$). Consequently, the average voltage of the waveform (triangle wave) signal (V_TRI) is offset from (no longer equal to) the voltages of the modulation signals (MODP, MODN), which are equal to one half of the common mode voltage ($V_{REFC}/2$). This offset causes the common mode duty cycles of the first and second quantized signals (BR_OUTP, BR_OUTN) to be shifted so that the common mode duty cycles of the quantized signals (BR_OUTP, BR_OUTN), and by consequence, the common mode duty cycles of the output signals (OUTP, OUTN) to be shifted away from fifty percent (50%). Because the output signals (OUTP, OUTN) are shifted by the same amount, the differential output signal (OUTP-OUTN) remains equal to zero (0).

As can be seen from FIG. 4, shifting the common mode duty cycles of the output signals (OUTP, OUTN) away from fifty percent (50%) as shown in FIGS. 3B and 3C, so that they are greater than or less than fifty percent (50%) reduces the power consumed by the load, increasing the efficiency of the amplifier.

Figure 5:
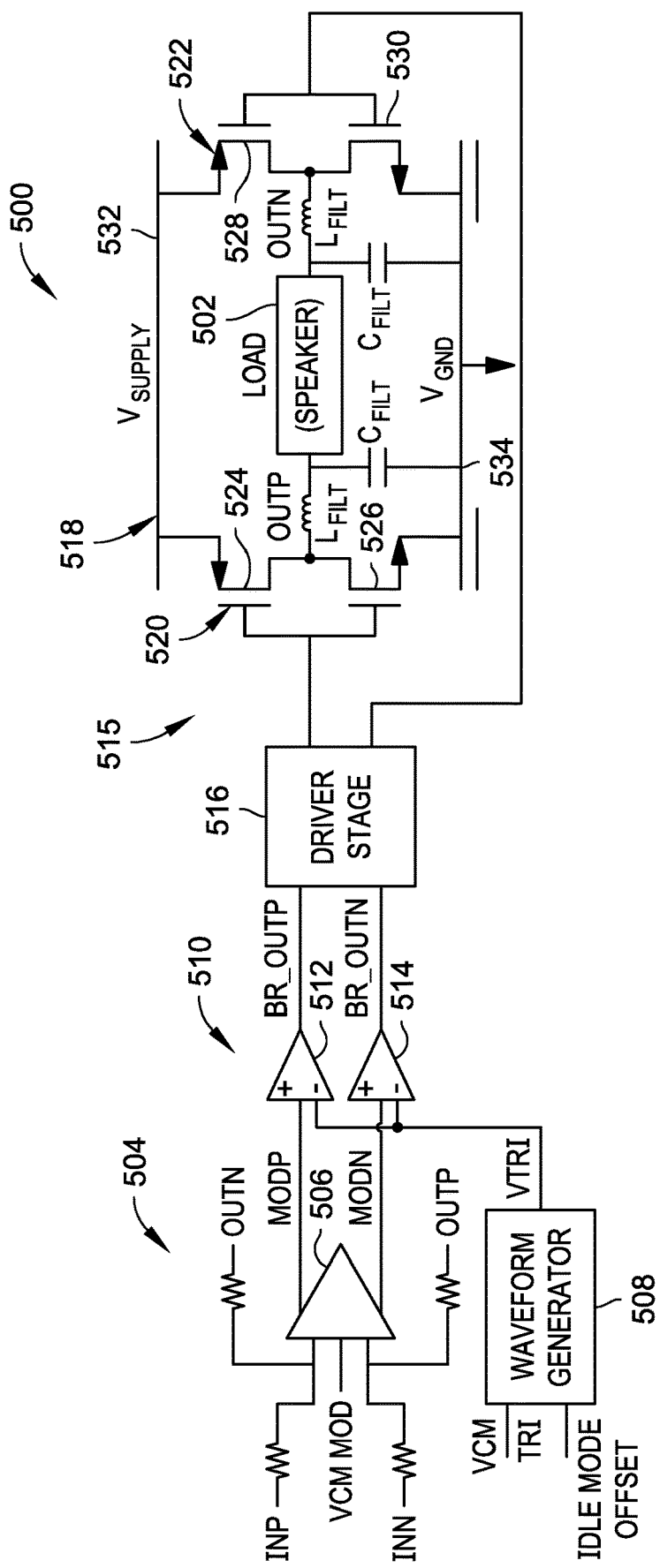
FIG. 5 is a circuit diagram illustrating a second example audio amplifier having an idle mode in accordance with the present disclosure.

FIG. 5 illustrates an amplifier 500 configured with an idle mode in accordance with an example embodiment of the present disclosure. Like the amplifiers 100, 200 shown in FIGS. 1 and 2, the amplifier 500 is configured to receive an analog input having a common mode component and to drive a load 502 such as a speaker, or the like, based on that input signal.

The amplifier 500 includes a modulator 504 having an amplifier assembly 506 that may comprise one or more amplifiers or other components. The amplifier assembly 506 receives analog input signals (INP, INN), a common mode component (VCM_MOD), and output signals (OUTP, OUTN), and generates differential first (P) and second (N) modulation signals (MODP, MODN), wherein the first (P) modulation signal has a second voltage and a second (N) modulation signal has a third voltage.

The modulator 504 further includes a waveform generator 508 for generating a waveform signal. In the embodiment illustrated, the waveform generator 508 comprises a triangle wave generator configured to receive a waveform input signal (VCM_TRI) that causes the waveform generator 508 to generate a triangle wave signal (V_TRI) having a fourth voltage centered on the common mode voltage ($V_{REFC}/2$) when idle mode is not enabled. In other embodiments, waveform generators 508 producing other waveforms, such as a sawtooth wave, may be utilized. However, it is contemplated that such other waveforms will have voltages also centered on the common mode voltage ($V_{REFC}$) when idle mode is not enabled.

A comparator assembly 510 is coupled to amplifier assembly 506 and the waveform generator 508 and receives the first and second modulation signals (MODP, MODN) and the waveform (triangle wave) signal (V_TRI). As shown in FIG. 5, the comparator assembly 510 includes a first (P) comparator 512 having a positive analog input terminal that receives the first modulation signal (MODP) and a negative analog input terminal that receives the waveform (triangle wave) signal (V_TRI). The first comparator 512 outputs a first (P) quantized signal (BR_OUTP). As further shown, the comparator assembly 510 also includes a second (N) comparator 514 having a negative analog input terminal that receives the second modulation signal (MODN) and a positive analog input terminal that receives the waveform (triangle wave) signal (V_TRI). The second comparator 514 outputs the second (N) quantized signal (BR_OUTN).

In embodiments, the comparator assembly employs pulse width modulation (PWM) to encode the first and second modulation signals (MODP, MODN) into a pulse trains to generate the first and second quantized signals (BR_OUTP, BR_OUTN). However, it is contemplated that other modulation techniques, such as pulse density modulation (PDM), delta-sigma modulation (DSM), and so forth, may also be utilized.

The first and second quantized signals (BR_OUTP, BR_OUTN) are then passed to an output stage 515, which drives the load (speaker 502). In the embodiment illustrated, the output stage 515 includes a driver stage 516 and a power stage 518. The output stage 515 employs a full-bridge power stage 518 comprised of two half-bridges 520, 522 that drive the load (speaker) 502 differentially in a bridge-tied load (BTL) configuration. Each half bridge 520, 522 includes two output switching devices (e.g., power field effect transistors (FETs)). In the embodiment illustrated, metal-oxide-semiconductor field-effect transistors (MOSFETs) 524, 526 and 528, 530, respectively, are shown. The first half bridge 520 includes a first p-channel MOSFET 524 having its gate coupled to the first (P) quantized signal produced by comparator 512, its source coupled to a supply voltage rail ($V_{SUPPLY}$) 532, and its drain coupled with the load (speaker) 502, and a second n-channel MOSFET 526 having its gate coupled to the first (P) quantized signal produced by comparator 512, its source coupled to a second voltage such as a ground rail ($V_{GND}$) 534, and its drain coupled with the load (speaker) 502. The second half bridge 522 includes a first p-channel MOSFET 528 having its gate coupled to the second (N) quantized signal produced by comparator 514, its source coupled to a supply voltage rail ($V_{SUPPLY}$) 532, and its drain coupled with the load (speaker) 502, and a second n-channel MOSFET 530 having its gate coupled to the second (N) quantized signal produced by comparator 514, its source coupled to a second voltage such as a ground rail ($V_{GND}$) 534, and its drain coupled with the load (speaker) 502. As shown, the p-channel and n-channel MOSFETs 524, 528 and 526, 530, respectively, operate as current-steering switches by alternately connecting their output (OUTP, OUTN) to the supply voltage ($V_{SUPPLY}$) and a second voltage (e.g., ground ($V_{GND}$)) so that the resulting outputs (OUTP, OUTN) are high-frequency square waves. The driver stage 516 receives the first and second quantized signals (BR_OUTP, BR_OUTN) from the modulator 504, level shifts them, if necessary, and drives the MOSFETs 524, 526, 528, 530 of the power stage 518.

Low-pass LC filters 536, 538 are provided between each half bridge 518, 520, respectively, and the load (speaker) 502 to recover the amplified audio signal. The low-pass LC filters 536, 538, which are comprised of inductors ($L_{FILT}$) and capacitors ($C_{FILT}$), filter electromagnetic interference from the output signals (OUTP, OUTN) preventing high-frequency switching energy from being dissipated in the resistive load (speaker) 502.

Because the output signals (OUTP, OUTN) comprise square waves that are pulse-width modulated by the input audio signal, the resulting duty cycle of the output signals (OUTP, OUTN) are proportional to the level of the input signal. When no input signal is present, the duty cycle of the output signals (OUTP, OUTN) waveforms is equal to fifty percent (50%).

In accordance with the present disclosure, the audio amplifier 500 illustrated in FIG. 5 includes an idle mode of operation when there is no or very low input signal to reduce power consumption and improve efficiency of the amplifier 500. During the idle mode, when the voltage of the analog input signal drops below a threshold level so that the common mode component of the input signal (VCM_MOD), which has a voltage equal to one half of the common mode voltage ($V_{REFC}/2$), is input to the amplifier assembly, the modulator 504 is configured to cause the common mode duty cycle of each of the first and second quantized signals (BR_OUTP, BR_OUTN) to be shifted so that the common mode duty cycle is greater than or less than fifty percent (50%). In an embodiment, the threshold voltage is substantially zero volts (0V). The threshold voltage may also be programmable so that may be set, for example, using an input to the modulator 504.

As shown in FIG. 5, an idle mode offset signal (IDLE MODE OFFSET) is provided as an input to the waveform generator 508. The idle mode offset signal (IDLE MODE OFFSET) causes a voltage offset to be added to (or subtracted from) the voltage of the waveform (triangle wave) input signal (VCM_TRI) by the waveform generator 508 so that the voltage of the triangle wave signal (V_TRI) is increased (or decreased) and thus no longer centered on the common mode voltage ($V_{REFC}/2$). In other embodiments, the idle mode offset signal (IDLE MODE OFFSET) may cause a voltage offset to be added to (or subtracted from) the voltage of the common mode component of the input signal (VCM_MOD) by the amplifier assembly 506 so that the voltages of the differential first (P) and second (N) modulation signals (MODP, MODN) are increased (or decreased). Increasing (or decreasing) either or both of the voltage of the waveform (triangle wave) signal (V_TRI) and the first (P) and second (N) modulation signals (MODP, MODN) causes the common mode duty cycles of the first and second quantized signals (BR_OUTP, BR_OUTN) output by the respective first and second comparators 512, 514 of the comparator assembly 510 to be shifted so that the common mode duty cycles of the quantized signals (BR_OUTP, BR_OUTN) are one of greater than or less than fifty percent (50%). In embodiments, the p-channel and n-channel MOSFETs 524, 528 and 526, 530, respectively, continue to switch the first and second output signals (OUTP, OUTN) between the supply voltage ($V_{SUPPLY}$) and a second voltage (e.g., ground ($V_{GND}$)) while the common mode duty cycle of each of the first and second quantized signals (BR_OUTP, BR_OUTN) is shifted away from fifty percent (50%). In this manner, the power consumed by the load (speaker) 502 is substantially reduced, increasing the efficiency of the amplifier 500.

In embodiments, the idle mode of the amplifier 500 may be disabled. For example, in an embodiment, the modulator 504 may be configured so that shifting of the common mode duty cycles of the first and second quantized signals (BR_OUTP, BR_OUTN) can be selectively disabled by the idle mode offset signal (IDLE MODE OFFSET).

Figure 6:
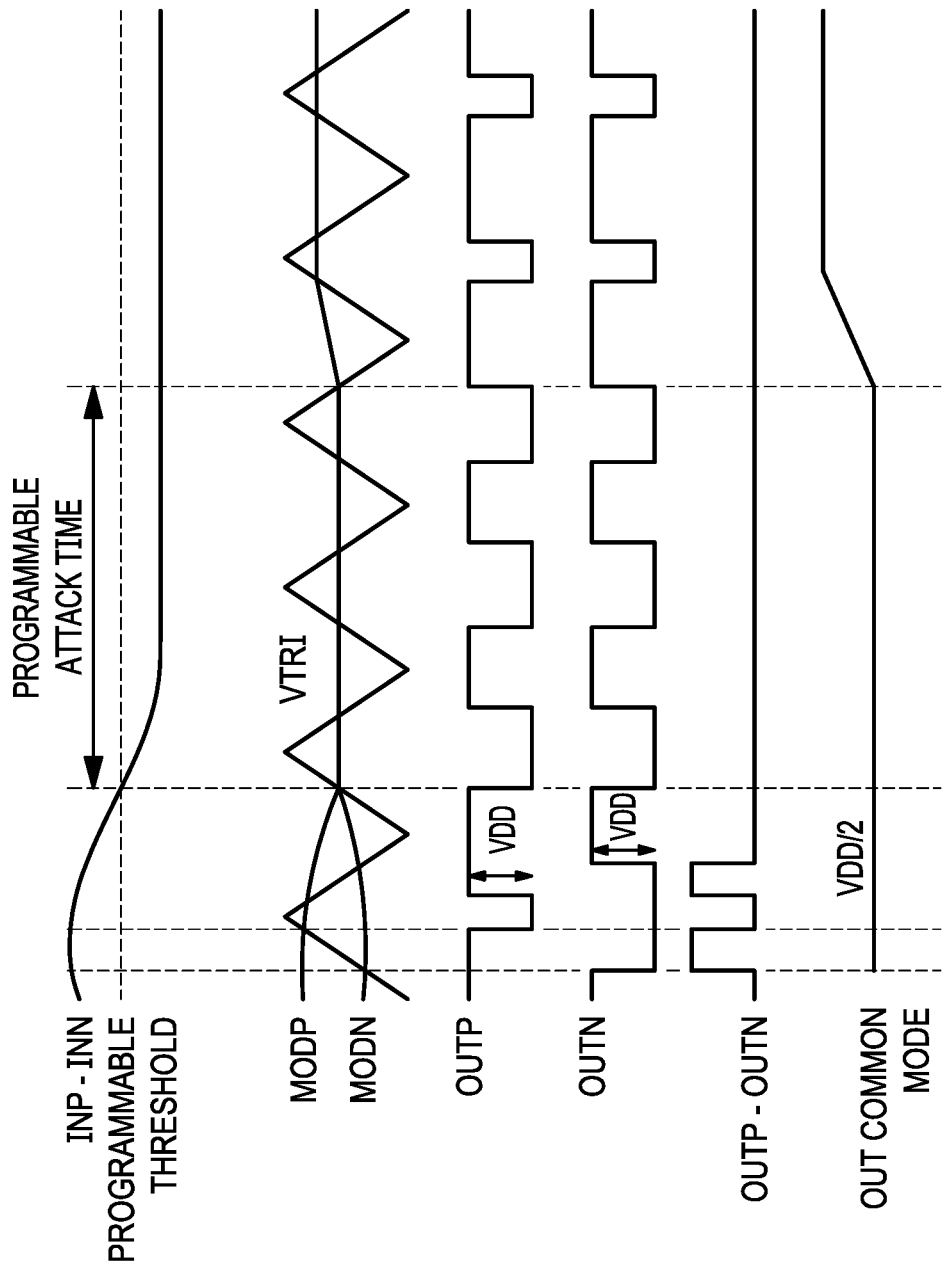
FIG. 6 is a signal diagram illustrating the implementation of an idle mode having a programmable attack time, by and audio amplifier, such as the amplifier shown in FIG. 5, in accordance with an embodiment of the present disclosure.
Figure 7:
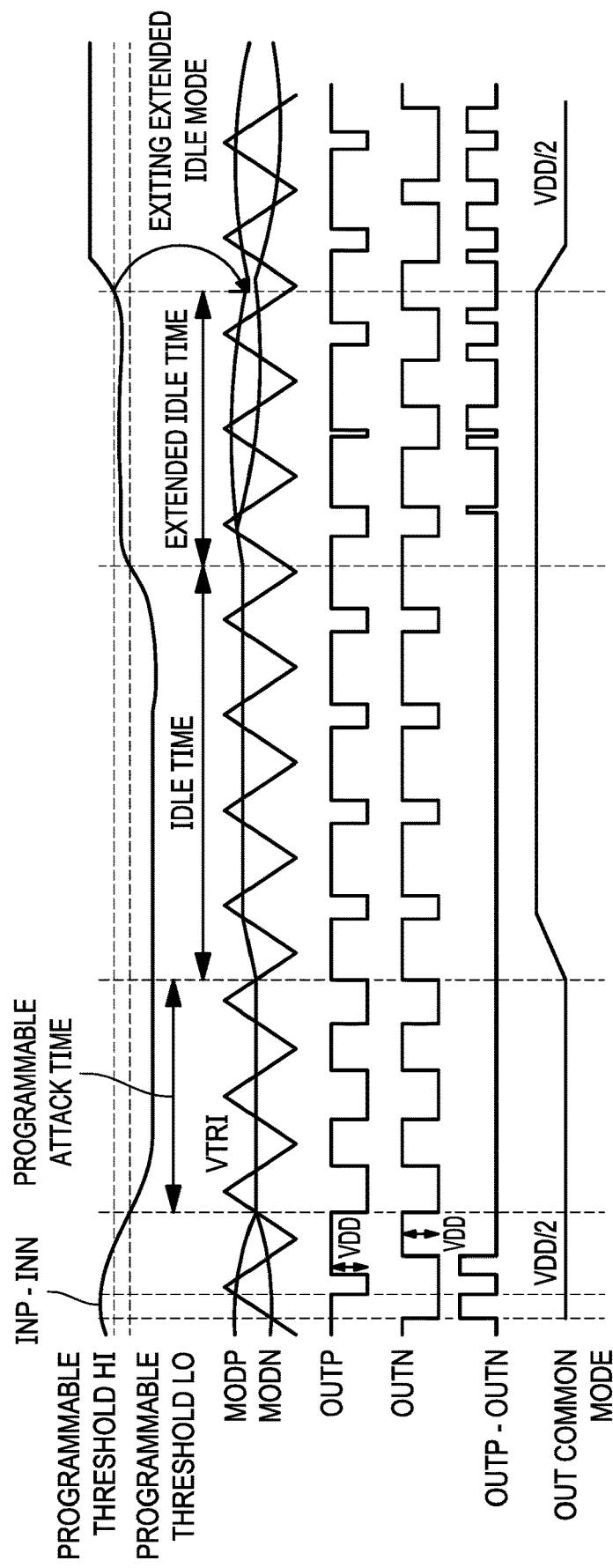
FIG. 7 is a signal diagram illustrating the implementation of an idle mode having a programmable attack time and an extended idle time period by an example audio amplifier in accordance with an embodiment of the present disclosure.

FIGS. 6 and 7 illustrate the implementation of an idle mode having a programmable attack time by an amplifier, such as the amplifier 500 shown in FIG. 5, in accordance with an embodiment of the present disclosure.

The level of the analog input signal is compared to a threshold level. In the embodiment illustrated, the level of the analog input signal may comprise a voltage determined as the difference between the voltages of the input signals (INP-INN) of the amplifier 500, which is compared to a threshold voltage. When the level of the analog input signal (INP-INN) is above the threshold voltage, the amplifier 500 modulates the first and second modulation signals (MODP, MODN) normally. Thus, the differential between the first and second modulation signals (MODP, MODN) causes the output signals (OUTP, OUTN) to have different duty cycles. Consequently, the differential output signal (OUTP-OUTN) comprises a pulsed wave that varies between the supply voltage ($V_{DD}$) to zero (0). The output common mode (OUT COMMON MODE) has a voltage equal to one half the supply voltage ($V_{DD}/2$).

When no analog input signal is present, so that the level (voltage) of the analog input signal (INP-INN) falls below the threshold voltage (PROGRAMMABLE THRESHOLD in FIG. 6, PROGRAMMABLE THRESHOLD LO in FIG. 7), the modulation signals (MODP, MODN) are equal to the average voltage of the waveform (triangle wave) signal (V_TRI). The output signals (OUTP, OUTN) have duty cycles equal to fifty percent (50%) and the differential output signal (OUTP-OUTN) is equal to zero (0). The voltage of the output common mode (OUT COMMON MODE) is equal to one half of the supply voltage ($V_{DD}/2$). As shown, this condition may continue for a period, herein referred to as the attack time (PROGRAMMABLE ATTACK TIME), before the idle mode is engaged.

After the attack time (PROGRAMMABLE ATTACK TIME) has expired, the idle mode is engaged, causing the voltages of the modulation signals (MODP, MODN) to be increased (or decreased). The voltages of the modulation signals (MODP, MODN) are thus offset from (no longer equal to) the average voltage of the waveform (triangle wave) signal (V_TRI). This offset causes the common mode duty cycles of the output signals (OUTP, OUTN) to be shifted away from fifty percent (50%). However, because the output signals (OUTP, OUTN) are shifted by the same amount, the differential output signal (OUTP-OUTN) remains equal to zero (0). The voltage of the output common mode (OUT COMMON MODE) is increased (or decreased) and is no longer equal to one half the supply voltage ($V_{DD}/2$).

In embodiments, the length of the attack time (PROGRAMMABLE ATTACK TIME) may be varied depending on the implementation and may be programmable via an input to the amplifier 500 (not shown).

FIG. 7 further illustrates the implementation of an extended idle time period by an amplifier, such as the amplifier shown in FIG. 5, in accordance with an embodiment of the present disclosure. As shown, when the level (voltage) of the analog input signal (INP-INN) falls below a first threshold voltage (PROGRAMMABLE THRESHOLD LO), the modulation signals (MODP, MODN) are equal to the average voltage of the waveform (triangle wave) signal (V_TRI). The output signals (OUTP, OUTN) have duty cycles equal to fifty percent (50%) and the differential output signal (OUTP-OUTN) is equal to zero (0). The voltage of the output common mode (OUT COMMON MODE) is equal to one half of the supply voltage ($V_{DD}/2$). As shown, this condition may continue for a period, herein referred to as the attack time (PROGRAMMABLE ATTACK TIME), before the idle mode is engaged. As described above, after the attack time (PROGRAMMABLE ATTACK TIME) has expired, the idle mode is engaged, causing the voltages of the modulation signals (MODP, MODN) to be increased (or decreased). The voltages of the modulation signals (MODP, MODN) are thus offset from (no longer equal to) the average voltage of the waveform (triangle wave) signal (V_TRI). This offset causes the common mode duty cycles of the output signals (OUTP, OUTN) to be shifted away from fifty percent (50%). However, because the output signals (OUTP, OUTN) are shifted by the same amount, the differential output signal (OUTP-OUTN) remains equal to zero (0). The voltage of the output common mode (OUT COMMON MODE) is increased (or decreased) and is no longer equal to one half the supply voltage ($V_{DD}/2$).

In embodiments, the amplifier 500 may continue operating in idle mode until the level (voltage) of the analog input signal (INP-INN) increases above a second threshold level (voltage) (PROGRAMMABLE THRESHOLD HI). Thus, as shown in FIG. 7, the amplifier may continue operating in an extended idle mode (EXTENDED IDLE MODE) even though some analog input signal is present and the differential output signal (OUTP-OUTN) comprises a pulsed wave that varies between the supply voltage ($V_{DD}$) to zero (0). However, the voltage of the output common mode (OUT COMMON MODE) remains increased (or decreased) and is no longer equal to one half the supply voltage ($V_{DD}/2$). When the level (voltage) of the analog input signal (INP-INN) increases above a second threshold level (voltage) (PROGRAMMABLE THRESHOLD HI) the amplifier 500 exits idle mode and returns to normal modulation. This return can be done either continuously or in discreet steps so that that the duty cycle shift does not cause signal distortion with increasing audio signal amplitude. In embodiments, the p-channel and n-channel MOSFETs 524, 528 and 526, 530, respectively, continue to switch the first and second output signals (OUTP, OUTN) between the supply voltage ($V_{SUPPLY}$) and a second voltage (e.g., ground ($V_{GND}$)) while the amplifier 500 is in idle mode (e.g., while the common mode duty cycle of each of the first and second quantized signals (BR_OUTP, BR_OUTN) is shifted away from fifty percent (50%)).

In embodiments, the voltage of the output common mode signal may be equal to the average of the common mode duty cycles multiplied by the supply voltage. Thus:

$$\text{OUT COMMON MODE} = (D_1 \times V_{DD} + D_2 \times V_{DD})/2$$

where $D_1$ is the duty cycle of the first output signal (OUTP) and $D_2$ is the duty cycle of the second output signal (OUTN). Thus, for example, where the duty cycles are both fifty percent ($D_1=D_2=0.5$), as would happen during the programmable attack time (PROGRAMMABLE ATTACK TIME) in FIGS. 6 and 7), the voltage of the output common mode signal (OUT COMMON MODE) is equal to one half of the supply voltage (OUT COMMON MODE=$0.5 \times V_{DD}$). Where the duty cycles are both shifted to eighty percent ($D_1=D_2=0.8$), as would happen during the idle mode, the voltage of the output common mode signal (OUT COMMON MODE) is equal to eighty percent of the supply voltage (OUT COMMON MODE=$0.8 \times V_{DD}$). Where the duty cycle of the first output signal (OUTP) is eighty-two percent ($D_1=0.82$) and the duty cycle of the second output signal (OUTN) is seventy-eight percent ($D_1=0.78$), as would happen during an extended idle mode (EXTENDED IDLE MODE), the voltage of the output common mode signal (OUT COMMON MODE) is equal to eighty percent of the supply voltage (OUT COMMON MODE=$0.8 \times V_{DD}$), even though the differential output signal (OUTP-OUTN) is no longer 0. It will be appreciated that the values selected for duty cycles of the output signals (OUTP, OUTN) (0.8, 0.82, 0.78) are examples only. Thus, the duty cycles may have other values. Additionally, in the examples provided, the duty cycles have undergone a positive shift, i.e., where the common mode output (OUT COMMON MODE) is increased from nominal ($V_{DD}/2$). However, it will be appreciated that the duty cycles may also undergo a negative shift, i.e., where output common mode (OUT COMMON MODE) is increased from nominal ($V_{DD}/2$) with the same or similar reduction in power usage.

In embodiments, the amounts of the shift to the duty cycles of the output signals (OUTP, OUTN) may be varied depending on the implementation and may be programmable via an input to the amplifier 500 (not shown). Additionally, in embodiments, the threshold level or voltage (PROGRAMMABLE THRESHOLD in FIG. 6, PROGRAMMABLE THRESHOLD LO and PROGRAMMABLE THRESHOLD LEVEL HI in FIG. 7), may be programmable via an input to the amplifier 500 (not shown).

Example Methods

Figure 8:
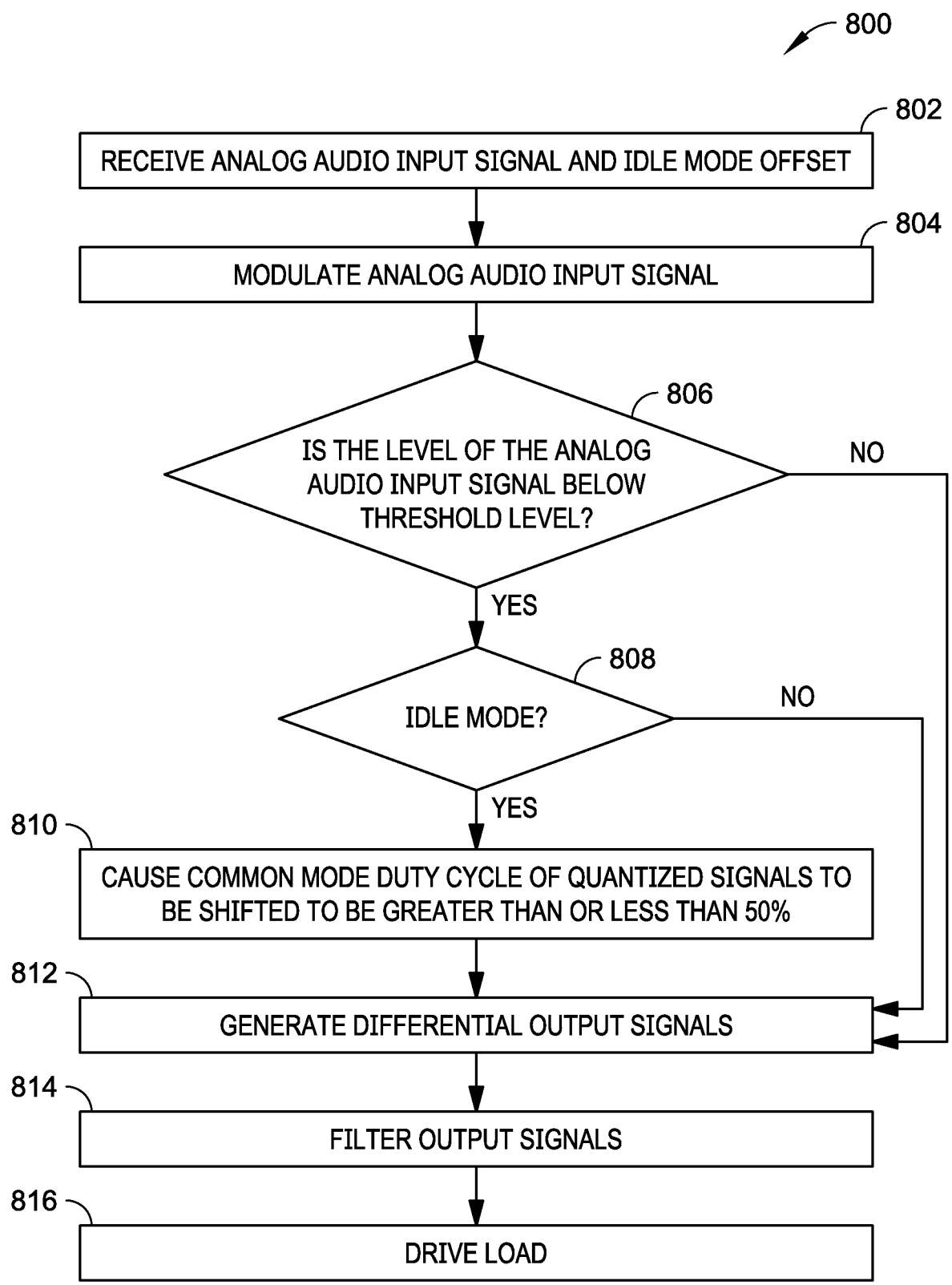
FIG. 8 is a flow diagram illustrating a method for implementing an idle mode in an audio amplifier, such as the example amplifiers shown in FIGS. 1, 2, and 5, in accordance with example embodiments of the present disclosure.

FIG. 8 illustrates a method 800 for implementing an idle mode in an audio amplifier, such as the example amplifiers 100, 200, and 500 shown in FIGS. 1, 2, and 5, respectively, in accordance with the present disclosure. The method 800 allows the power consumed by a speaker employing a class D audio amplifier to be reduced. As shown, the method 800 includes receiving an analog audio input signal (Block 802). For example, in embodiments, the analog audio input signal may comprise a first (P) audio input signal (INP) and a second (N) audio input signal (INN). The level of the analog audio input signal may comprise a voltage determined as the difference between the voltages of the input signals (INP-INN). The audio input signal is modulated to provide differential quantized signals (BR_OUTP, BR_OUTN), (Block 804), each having a common mode duty cycle. In embodiments, modulating the analog input signals (INP, INN) to provide the quantized signals (BR_OUTP, BR_OUTN) is accomplished by furnishing differential modulation signals (MODP, MODN) derived from the analog audio signals (INP, INN). The modulation signals (MODP, MODN) each have voltages proportional to the analog input signal. A waveform signal such as a triangle wave, saw tooth wave, etc. (V_TRI), having a voltage centered on a common mode voltage, is also generated. The respective modulation signals (MODP, MODN) and the waveform signal (V_TRI) are used to produce the quantized signals (BR_OUTP, BR_OUTN) using a modulation technique such as pulse width modulation (PWM).

The level of the analog input signal (INP-INN) is compared to a threshold level (Block 806). In an embodiment, the threshold voltage is substantially zero volts (0V). The threshold voltage may also be programmable so that may be set, for example, using an input to the amplifier.

When the level of the analog input signal (INP-INN) is determined to be above the threshold level (voltage) (NO at Block 806), modulation of the analog input signal continues normally generating output signals (OUTP, OUTN) (Block 812). The output signals (OUTP, OUTN) switched between a supply voltage and a second voltage based on the differential quantized signals. Consequently, the differential output signal (OUTP-OUTN) comprises a pulsed wave that varies between the supply voltage ($V_{DD}$) to zero (0).

When the level of the analog audio input signal (INP-INN) is below the threshold level (YES at Block 806), a second determination is made whether the idle mode of the amplifier is engaged (Block 810). For example, the amplifier may receive an Idle Mode Offset signal. When idle mode is not engaged, for example, no Idle Mode Signal is received (e.g., the idle mode is disabled), or during a programmable attack time as discussed in the description of FIG. 6, output signals (OUTP, OUTN) are generated (BLOCK 812) that have duty cycles equal to fifty percent (50%) and the differential output signal (OUTP-OUTN) is equal to zero (0). When the idle mode is engaged, for example, following expiration of the programmable attack time, the common mode duty cycle of each of the quantized signals is shifted so that the common mode duty cycle is one of greater than or less than fifty percent (50%) (Block 810). Output signals (OUTP, OUTN) are then generated (BLOCK 812) that have duty cycles shifted away from fifty percent (50%), while the differential output signal (OUTP-OUTN) is equal to zero (0). The output signals (OUTP, OUTN) drive the load (speaker) (Block 816). In embodiments, electromagnetic interference may be filtered from the output signals (OUTP, OUTN) using a low-pass filter such as a low-pass LC filter, or the like.

In embodiments, the common mode duty cycles of the quantized signals (BR_OUTP, BR_OUTN), and output signals (OUTP, OUTN) are shifted by increasing or decreasing at least one of the voltages of the modulation signals (MODP, MODN) or the average voltage of the waveform (triangle wave) signal (V_TRI) when the level (voltage) of the input signal (INP-INN) is below the threshold level (voltage).

In embodiments, the digital output signals (OUTP, OUTN) are shifted as a function of the amplitude of the analog audio signal. For example, the common mode duty cycle of each of the first and second quantized signals (BR_OUTP, BR_OUTN), and the corresponding output signals (OUTP, OUTN) are shifted when the level (voltage) of the analog input signal (INP-INN) is below the threshold level (voltage) until the level of the analog input signal (INP-INN) is above a second threshold level (voltage), wherein the second threshold level (voltage) is higher than the first threshold level (voltage).

Generally, any of the functions described herein can be implemented using hardware (e.g., fixed logic circuitry such as integrated circuits), software, firmware, manual processing, or a combination thereof. Thus, the blocks discussed in the above disclosure generally represent hardware (e.g., fixed logic circuitry such as integrated circuits), software, firmware, or a combination thereof. In the instance of a hardware configuration, the various blocks discussed in the above disclosure may be implemented as integrated circuits along with other functionality. Such integrated circuits may include all of the functions of a given block, system, or circuit, or a portion of the functions of the block, system, or circuit. Further, elements of the blocks, systems, or circuits may be implemented across multiple integrated circuits. Such integrated circuits may include various integrated circuits, including, but not necessarily limited to: a monolithic integrated circuit, a flip chip integrated circuit, a multichip module integrated circuit, and/or a mixed signal integrated circuit. In the instance of a software implementation, the various blocks discussed in the above disclosure represent executable instructions (e.g., program code) that perform specified tasks when executed on a processor. These executable instructions can be stored in one or more tangible computer readable media. In some such instances, the entire system, block, or circuit may be implemented using its software or firmware equivalent. In other instances, one part of a given system, block, or circuit may be implemented in software or firmware, while other parts are implemented in hardware.

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A BD modulator for an audio amplifier comprising:
   an amplifier assembly configured to receive an analog audio signal having a first voltage and to furnish differential first and second modulation signals, the first modulation signal having a second voltage and the second modulation signal having a third voltage;
   a waveform generator for generating a waveform signal having a fourth voltage centered on a common mode voltage; and
   a comparator assembly configured to receive the waveform signal and the first and second modulation signals and to provide respective differential first and second quantized signals, each of the first and second quantized signals having a common mode duty cycle,
   wherein at least one of the fourth voltage or the second and third voltages are increased or decreased when the first voltage is below a threshold voltage to shift the common mode duty cycles of the first and second quantized signals so that the common mode duty cycles are one of greater than or less than fifty percent (50%).

2. The BD modulator for an audio amplifier as recited in claim 1, wherein the waveform generator comprises a triangle wave generator, and the waveform signal comprises a triangle wave.

3. The BD modulator as recited in claim 1, wherein at least one of the amplifier assembly and the waveform generator is further configured to receive an idle mode offset having an idle mode offset voltage, the idle mode offset voltage for causing the second and third voltages or the fourth voltage to be increased or decreased.

4. The BD modulator as recited in claim 1, wherein the threshold voltage is substantially zero volts (0V).

5. The BD modulator as recited in claim 1, wherein the threshold voltage is programmable.

6. The BD modulator as recited in claim 1, wherein the comparator assembly is operable to generate the first and second quantized signals using pulse width modulation (PWM).

7. A class D audio amplifier comprising:
   a BD modulator configured to receive an analog audio signal having a first voltage and an idle mode offset having an offset voltage, the BD modulator comprising:
      an amplifier assembly operable to furnish differential first and second modulation signals derived from the first voltage, the first modulation signal having a second voltage and the second modulation signal having a third voltage;
      a triangle wave generator for generating a triangle wave signal having a fourth voltage centered on a common mode voltage;
      a comparator assembly configured to receive the triangle wave signal and the first and second modulation signals and to provide respective differential first and second quantized signals, each of the first and second quantized signals having a common mode duty cycle,
      wherein the BD modulator causes the second and third voltages or the fourth voltage to be increased or decreased when the first voltage is below a threshold voltage to shift the common mode duty cycles of the first and second quantized signals so that the common mode duty cycles are one of greater than or less than fifty percent (50%);

a power stage for receiving the first and second quantized signals and generating respective first and second output signals, the first and second output signals switched between a supply voltage and a fifth voltage based on the first and second quantized signals; and a low-pass LC filter for receiving the first and second output signals from the power stage and filtering electromagnetic interference, the first and second output signals being configured to drive a speaker.

8. The class D audio amplifier as recited in claim 7, wherein the threshold voltage comprises a programmable voltage.

9. The class D audio amplifier as recited in claim 7, wherein the BD modulator comprises an attack time for shifting the first and second quantized signals, and wherein the attack time is programmable.

10. The class D audio amplifier as recited in claim 7, wherein the BD modulator is configured so that shifting of the common mode duty cycles of the first and second quantized signals can be selectively disabled.

11. The class D audio amplifier as recited in claim 7, wherein the digital output signal is shifted as a function of the amplitude of the analog audio signal, wherein the BD modulator causes the common mode duty cycle of each of the first and second quantized signals to be shifted when the level of the analog input signal is below the threshold level until the analog input signal is above a second threshold level, the second threshold level being higher than the threshold level.

* * * * *